(12) United States Patent
Ogawa

(10) Patent No.: US 8,269,188 B2
(45) Date of Patent: Sep. 18, 2012

(54) CHARGED PARTICLE BEAM APPARATUS AND SAMPLE PROCESSING METHOD

(75) Inventor: Takashi Ogawa, Chiba (JP)

(73) Assignee: SII NanoTechnology Inc. (JP)

( * ) Notice: Subject to any disclaimer, the term of this patent is extended or adjusted under 35 U.S.C. 154(b) by 0 days.

(21) Appl. No.: 13/135,300

(22) Filed: Jun. 30, 2011

(65) Prior Publication Data

US 2012/0001086 A1    Jan. 5, 2012

(30) Foreign Application Priority Data

Jul. 5, 2010  (JP) .................. 2010-153110
May 6, 2011  (JP) .................. 2011-103712

(51) Int. Cl.
*H01J 3/14*   (2006.01)
*H01J 37/28*  (2006.01)
*H01J 37/30*  (2006.01)

(52) U.S. Cl. .................. 250/396 R; 250/306; 250/307; 250/310; 250/492.2; 250/492.3

(58) Field of Classification Search .............. 250/396 R, 250/306, 307, 310, 492.2, 492.3; 315/111.61
See application file for complete search history.

(56) References Cited

U.S. PATENT DOCUMENTS

| 6,956,211 B2 * | 10/2005 | Sato et al. .................. 850/1 |
| 2009/0302233 A1 * | 12/2009 | Ogawa .................. 250/396 R |
| 2010/0116984 A1 * | 5/2010 | Ogawa et al. .................. 250/307 |

FOREIGN PATENT DOCUMENTS

| JP | 200766710 | 3/2007 |
| JP | 2007103108 | 4/2007 |

* cited by examiner

*Primary Examiner* — Nikita Wells
(74) *Attorney, Agent, or Firm* — Adams & Wilks

(57) ABSTRACT

A charged particle beam apparatus includes an ion beam column having an ion source for generating an ion beam, a first objective lens electrode which forms a first objective lens for focusing the ion beam on a sample, and a second objective lens electrode which is disposed at a position closer to the sample than the first objective lens electrode and forms a second objective lens for focusing an ion beam accelerated with a lower acceleration voltage on the sample.

13 Claims, 10 Drawing Sheets

CHARGED PARTICLE BEAM APPARATUS AND SAMPLE PROCESSING METHOD

BACKGROUND OF THE INVENTION

1. Field of the Invention

The present invention relates to a charged particle beam apparatus for processing a sample by using a focused ion beam.

2. Description of the Related Art

As semiconductor devices become more finely patterned, there has been increasing importance placed on a technology which uses a transmission electron microscope (TEM) to observe and analyze a minute area of the device. When the TEM is used to make an observation, it is necessary to process the minute area into a sample lamella having such a thickness that allows an electron beam to be transmitted therethrough. For the fabrication of the sample lamella, a focused ion beam apparatus has been widely used. However, when a sample lamella is fabricated using the focused ion beam apparatus, there is a problem that a damaged layer is formed in the sample lamella due to irradiation of the focused ion beam.

One known method for solving this problem is to employ an apparatus in which the focused ion beam apparatus is provided with an argon-ion beam irradiation unit (see Japanese Patent Application Publication No. 2007-66710).

With this method, a damaged layer formed due to the irradiation of the focused ion beam is irradiated with an argon-ion beam from an appropriate angle, thereby performing removal processing.

Further, another known method is to fabricate a sample lamella by using a focused ion beam accelerated with a low acceleration voltage. With this method, the thickness of a damaged layer formed in the sample lamella can be made smaller. However, when the focused ion beam is accelerated with a low acceleration voltage, chromatic aberration of the ion beam optical system becomes larger. For this reason, the beam diameter of the focused ion beam cannot be made small, which is problematic.

As a method for solving this problem, there is known a method involving the employment of a focused ion beam column including an intermediate acceleration tube (see Japanese Patent Application Pubrication No. 2007-103108).

With this method, it is possible to reduce chromatic aberration of the optical system, and also to allow the focused ion beam having small energy to reach the sample.

Further, still another known method is the retarding method in which a voltage is applied to the sample. With this method, the energy of the focused ion beam is reduced immediately before the focused ion beam reaches the sample, and hence aberration can be made smaller.

However, the conventional apparatuses have the following problems.

Specifically, the configuration of the apparatus provided with the argon-ion beam irradiation unit is complex. Further, in the case of the apparatus provided with the focused ion beam column including the intermediate acceleration tube, the structure of the column is complex. Further, in the case of using the retarding method, it is necessary to form an electric field which is symmetric with respect to the focused ion beam, between the focused ion beam column and the sample. However, if the apparatus is provided with an electron beam column for sample observation, the electric field in the vicinity of the sample becomes asymmetric. Thus, the retarding effect cannot be obtained.

SUMMARY OF THE INVENTION

In view of the above-mentioned circumstances, the present invention has been made, and therefore has an object to provide a charged particle beam apparatus capable of, without using a complex apparatus configuration, irradiation with a focused ion beam having a small beam diameter even when an acceleration voltage is made smaller.

In order to achieve the above-mentioned object, the present invention provides the following means.

A charged particle beam apparatus according to the present invention includes: a sample chamber for housing a sample; and an ion beam column for accelerating an ion beam with an acceleration voltage, and focusing the ion beam on the sample to irradiate the sample, the ion beam column including: an ion source housed on a proximal side of the ion beam column, for generating the ion beam; and an ion optical system for irradiating the sample with the ion beam, the ion optical system including: a first objective lens electrode for focusing the ion beam on the sample; and a second objective lens electrode for focusing an ion beam accelerated with a second acceleration voltage, which is lower than a first acceleration voltage used to accelerate the ion beam, on the sample. With this configuration, in accordance with the acceleration voltage of the ion beam, an optimum objective lens can be formed, and the ion beam having a small beam diameter can be focused on the sample.

In the above-mentioned charged particle beam apparatus, it is more preferred that the second objective lens electrode be disposed on a distal side of the ion beam column, relative to the first objective lens electrode. By using the second objective lens disposed at a position closer to the sample than the first objective lens, a distance between the lens and a focal point is shortened. Therefore, even when the ion beam is accelerated with a low acceleration voltage, chromatic aberration can be made smaller.

In the above-mentioned charged particle beam apparatus, it is more preferred that the first objective lens electrode include a plurality of electrodes, that the plurality of electrodes include at least a grounded electrode disposed adjacent to the second objective lens electrode, and that the grounded electrode, the second objective lens electrode, and a distal portion of the ion beam column, which is grounded, form a lens electric field for focusing the ion beam accelerated with the second acceleration voltage. Specifically, the charged particle beam apparatus forms an Einzel lens with the second objective lens electrode at the center. With this configuration, the second objective lens electrode can be configured by a single electrode. Therefore, the lens electrodes can be put together with more ease, with the result that a high-precision ion beam column is assembled with less deviation of the lens axis. Further, this enables the beam diameter to be made smaller. In particular, the axis deviation and tilt of the lens electrode cause field-of-view deviation of an observation image. Thus, it is important to put the lens electrodes together accurately. The axis deviation of the lens electrode is adjusted to be 15 μm or smaller.

In the above-mentioned charged particle beam apparatus, it is more preferred that the ion optical system further include a deflection electrode for deflecting the ion beam, which is disposed on the proximal side of the ion beam column relative to the first objective lens electrode, and that the deflection electrode deflect the ion beam accelerated with the first acceleration voltage so that the ion beam passes through a lens center of the first objective lens electrode, and deflect the ion beam accelerated with the second acceleration voltage so that the ion beam passes through a lens center of the second objective lens electrode. In other words, even when the lenses are switched over, the position through which the deflected ion beam passes is corrected to be at the center of the lens. With this configuration, the ion beam can be caused to enter the center of each lens, and hence aberration can made smaller. Further, even when the lenses are switched over, the irradiation position can be made identical. Then, even when the irradiation position of the ion beam is adjusted by using the deflection electrode, the ion beam passes through the center of the lens, and hence the observation image does not become blurred. Note that, the deflection electrode is configured by electrostatic electrodes provided in two stages, and thus, by adjusting the voltage ratio between the two vertically-provided electrodes, the ion beam is caused to enter the center of the lens.

In the above-mentioned charged particle beam apparatus, it is more preferred that the ion optical system further include a scanning electrode for scanning the ion beam, which is disposed on the proximal side of the ion beam column relative to the first objective lens, and that the scanning electrode scan the ion beam accelerated with the first acceleration voltage so that the ion beam passes through a lens center of the first objective lens electrode, and scan the ion beam accelerated with the second acceleration voltage so that the ion beam passes through a lens center of the second objective lens electrode. In other words, the scanned ion beam is caused to enter the center of the lens, thereby correcting the position through which the deflected ion beam passes to be at the center of the lens. With this configuration, even when the lenses are switched over, the position through which the deflected ion beam passes is corrected to be at the center of the lens, and hence distortion of the observation image can be alleviated. Note that, the scanning electrode is configured by electrostatic electrodes provided in two stages, and thus, by adjusting the voltage ratio between the two vertically-provided electrodes, the irradiation position of the ion beam is adjusted.

The ion optical system of the charged particle beam apparatus according to the present invention further includes: a focusing lens electrode for focusing the ion beam generated from the ion source; and an astigmatism correction electrode for correcting astigmatism of the ion beam.

In the above-mentioned charged particle beam apparatus, it is more preferred that the charged particle beam apparatus further include: an input unit for inputting acceleration voltages; a storage unit for storing set values for the ion optical system, which correspond to the acceleration voltages; and a control unit for setting the set values for the ion optical system, that the storage unit store first set values corresponding to the first acceleration voltage and second set values corresponding to the second acceleration voltage, and that the control unit set the first set values for the ion optical system when the first acceleration voltage is input from the input unit, and sets the second set values for the ion optical system when the second acceleration voltage is input from the input unit. With this configuration, in response to the switchover of the acceleration voltages, the settings of the ion optical system can be switched over, and hence operation can be performed smoothly without readjusting the beam. Further, even when the objective lenses used are switched over, the settings of the ion optical system are switched over to appropriate set values as well. Therefore, it is possible to observe the same position on the sample without significantly changing the observation area. Note that, it is more preferred that the storage unit store, in addition to the set values set for the ion optical system, an input sensitivity at the time of inputting the set values from the input unit. The input sensitivity refers to the operational sensitivity of the input unit when an operator inputs voltage values to be applied to the objective lens electrodes, the astigmatism correction electrode, and the deflection electrode.

In the above-mentioned charged particle beam apparatus, it is more preferred that the first set values include the set value for the first objective lens electrode indicating a constant voltage value, and the set value for the second objective lens electrode indicating 0, and that the second set values include the set value for the first objective lens electrode indicating 0, and the set value for the second objective lens electrode indicating a constant voltage value. By changing the objective lens electrode from a state of being supplied with a voltage to a state of being grounded, the switchover can be performed in a short period of time. In particular, by performing the switchover with the use of a switching unit employing a switch mechanism, it is possible to reduce drift of the irradiation position of the ion beam which occurs after the switchover of the objective lenses used.

In the above-mentioned charged particle beam apparatus, the second objective lens electrode includes a hole portion for allowing the ion beam to pass therethrough, a plate portion having a plane substantially perpendicular to the ion beam, and a cylindrical portion for allowing the ion beam to pass therethrough. The plate portion can prevent an insulating member disposed closer to the sample side than the plate portion from being irradiated with the ion beam. Further, when the first objective lens is formed, the grounded cylindrical portion functions as an anti-electric shield, and hence it is possible to reduce an influence exerted upon the ion beam from an external electric field.

The charged particle beam apparatus according to the present invention, further includes an electron beam column capable of irradiating, with an electron beam, an irradiation area of the ion beam on the sample, in which the electron beam column further includes a coil of an objective lens for electron beam for focusing the electron beam on the sample, and a distance between a center of the coil of the objective lens for electron beam and the sample is larger than a distance between a center of the second objective lens electrode of the ion beam column and the sample. With this configuration, it is possible to carry out an SEM observation by irradiating, with the electron beam, a sample processing area while the sample is being processed with the ion beam. Further, the second objective lens electrode can prevent the ion beam from being affected by the electric field generated by the objective lens for electron beam of the electron beam column. Further, asymmetricity of the electric field in the vicinity of the sample is alleviated, and hence it is possible to prevent secondary electrons generated from the electron beam and the sample from being affected by the electric field of the objective lens for electron beam.

A sample processing method according to the present invention includes: a first processing step of accelerating an ion beam with a first acceleration voltage, focusing the ion beam by means of a first objective lens, and processing a sample; and a second processing step of accelerating the ion beam with a second acceleration voltage, which is lower than the first acceleration voltage, focusing the ion beam by means of a second objective lens, which is disposed closer to the sample than the first objective lens, and processing the sample. With this configuration, in the second processing step, the sample can be processed so that the thickness of a damaged layer is made small by using the ion beam accelerated with the second acceleration voltage. Further, the ion beam is focused by the second objective lens disposed closer to the sample, and hence it is possible to perform the processing with the ion beam having small aberration and a small beam diameter.

According to the charged particle beam apparatus of the present invention, by using the second objective lens electrode, the sample can be irradiated with the focused ion beam having a small beam diameter even when the acceleration voltage is made smaller, thereby achieving sample processing in which the thickness of the damaged layer is made thin.

BRIEF DESCRIPTION OF THE DRAWINGS

In the accompanying drawings:

FIGS. 5A and 5B are schematic diagrams of sample processing of a sample processing method according to the embodiment of the present invention, of which FIG. 5A illustrates crude processing and FIG. 5B illustrates finish processing;

DETAILED DESCRIPTION OF THE PREFERRED EMBODIMENT

Hereinbelow, description is given of an embodiment of a charged particle beam apparatus according to the present invention.

Figure 1:
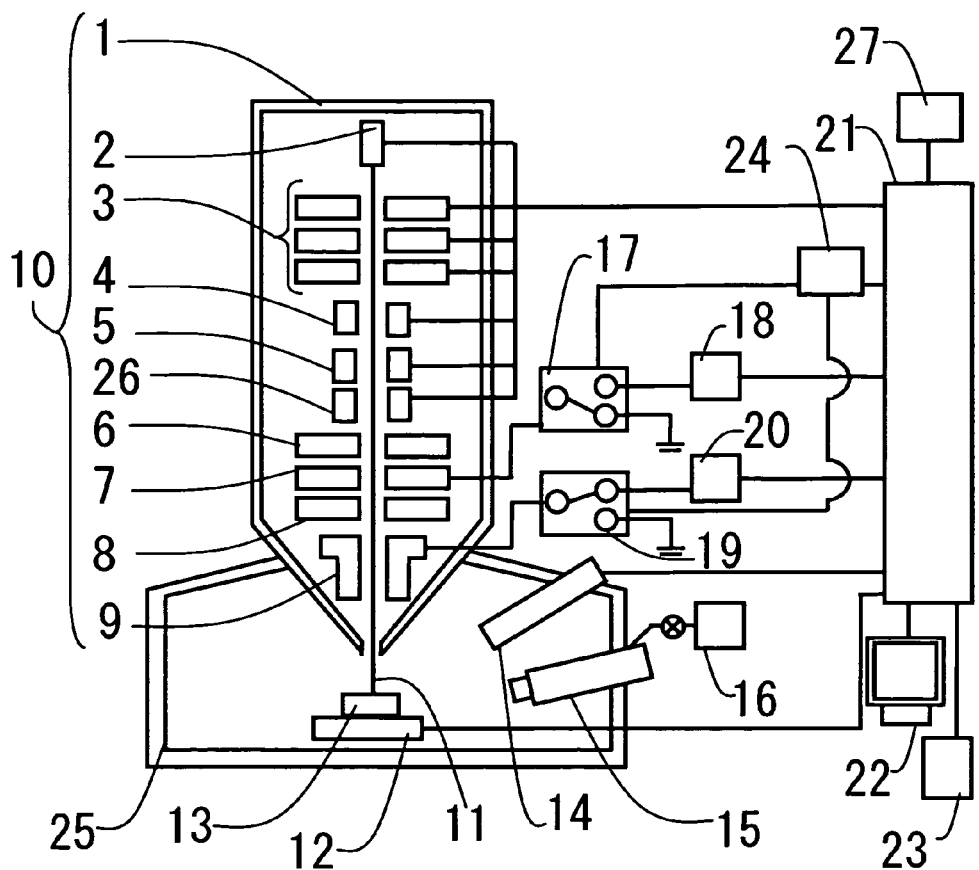
FIG. 1 is a configuration diagram of a charged particle beam apparatus according to an embodiment of the present invention.

As illustrated in FIG. 1, the charged particle beam apparatus according to the embodiment of the present invention includes an ion beam column 10 including: an ion source 2 for generating an ion beam 11; focusing lens electrodes 3 which constitute a focusing lens; a deflection electrode 4; an astigmatism correction electrode 5; a scanning electrode 26; first objective lens electrodes 6, 7, and 8 which constitute a first objective lens; and a second objective lens electrode 9 which constitutes a second objective lens. The ion beam column 10 includes a grounded ion beam column outer wall 1, and the optical axis of the ion beam 11 travels in a vacuum.

A sample chamber 25 includes: a sample stage 12 on which a sample 13 is to be placed; a secondary electron detector 14 for detecting secondary electrons generated from the sample 13; and a gas gun 15 for supplying a source gas or an etching gas to the sample.

A control unit 21 sends set values to the ion source 2, the focusing lens electrodes 3, the deflection electrode 4, the astigmatism correction electrode 5, and a first objective lens power source 18, respectively, in accordance with a condition for ion beam irradiation, which is input from an input unit 23 such as a keyboard or a mouse. Then, in accordance with the set values, the ion source, the respective electrodes, and the power source apply voltages having the set values, respectively. Further, the input condition for ion beam irradiation is stored in a storage unit 27. When switching of the irradiation condition has been input from the input unit 23, the control unit 21 reads, from the storage unit 27, the set values corresponding to the switching, and then sets voltages having the set values to the respective electrodes of the ion beam column 10. Further, the control unit 21 controls a movable aperture provided inside the ion beam column 10 so as to adjust the amount of current of the ion beam with which the sample 13 is to be irradiated. Further, the control unit 21 sends a movement signal to the sample stage 12 so that a desired position of the sample 13 can be irradiated with the ion beam 11, and causes the sample stage 12 to be moved. Then, the desired position of the sample 13 is irradiated with the ion beam 11, and secondary electrons generated from the sample 13 are detected by the secondary electron detector 14. The detected signal of the secondary electrons is sent to the control unit 21. The control unit 21 forms a secondary electron image based on the detected signal and a scanning signal from the ion beam 11. The secondary electron image is then displayed on a display unit 22.

Further, at the time of the irradiation with the ion beam 11, the source gas or the etching gas stored in a gas source container 16 is supplied from the gas gun 15 to the sample 13, and hence it is possible to perform deposition of the source gas material or accelerated etching by the etching gas in the irradiation area of the ion beam 11.

Figure 2:
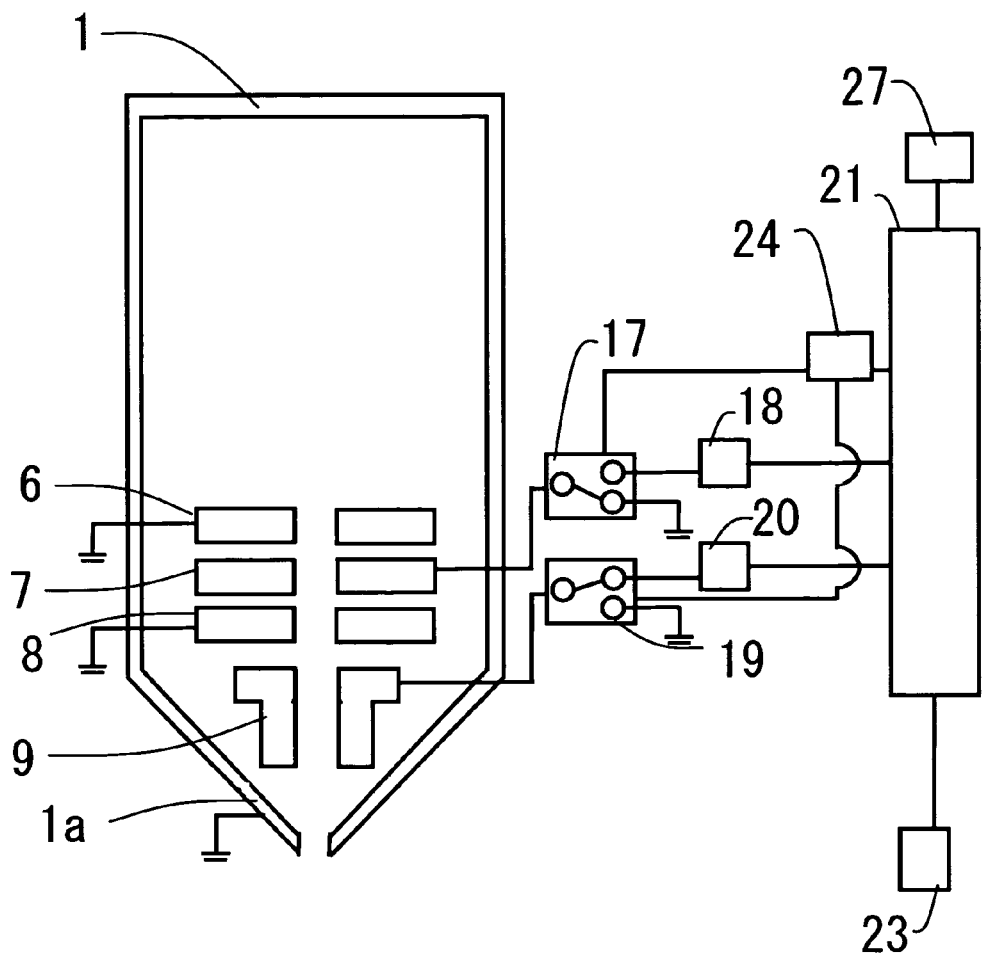
FIG. 2 is a wiring diagram of objective lens electrodes of the charged particle beam apparatus according to the embodiment of the present invention.

FIG. 2 is a wiring diagram of the objective lens electrodes of the charged particle beam apparatus according to the present invention. The first objective lens electrode 7 and the second objective lens electrode 9 are connected to a first switching unit 17 and a second switching unit 19, respectively. The first switching unit 17 can switch between a wiring which connects the first objective lens electrode 7 to the first objective lens power source 18 and a wiring which connects the first objective lens electrode 7 to the ground. Further, the second switching unit 19 can switch between a wiring which connects the second objective lens electrode 9 to a second objective lens power source 20 and a wiring which connects the second objective lens electrode 9 to the ground. Further, the first objective lens power source 18 and the second objective lens power source 20 are each connected to the control unit 21 so as to apply, to the lens electrodes, voltages having the set voltage values sent from the control unit 21.

An objective lens voltage control unit 24 controls the first switching unit 17 and the second switching unit 19. When the first objective lens is formed, the objective lens voltage control unit 24 sends a signal to the first switching unit 17 and the second switching unit 19 so as to set the wirings as follows. That is, the first switching unit 17 is caused to select the wiring which connects the first objective lens electrode 7 to the first objective lens power source 18, and the second switching unit 19 is caused to select the wiring which connects the second objective lens electrode 9 to the ground. Further, when the second objective lens is formed, the objective lens voltage control unit 24 sends to the first switching unit 17 and the second switching unit 19 so as to set the wirings as follows. That is, the first switching unit 17 is caused to select the wiring which connects the first objective lens electrode 7 to the ground, and the second switching unit 19 is caused to select the wiring which connects the second objective lens electrode 9 to the second objective lens power source 20.

When the first objective lens is formed, the first objective lens electrodes 6 and 8 are grounded, and the first objective lens electrode 7 is applied with a voltage equal to or smaller than 10 kV, thereby forming the first objective lens. At this time, the second objective lens electrode 9 is grounded and thus does not function as a lens. Note that, the first objective lens electrode 7 may be applied with a voltage having the positive polarity or a voltage having the negative polarity. However, if a negative voltage is applied to the first objective lens electrode 7 so as to accelerate the ion beam 11, chromatic aberration can be made smaller, and the irradiation can be carried out with the ion beam having a smaller beam diameter.

When the second objective lens is formed, the first objective lens electrodes 6, 7, and 8 are grounded, and the second objective lens electrode 9 is applied with a voltage equal to or smaller than 5 kV, thereby forming the second objective lens. The first objective lens electrode 8 adjacent to the second objective lens electrode 9 and a distal portion 1a of the ion beam column outer wall 1 are grounded, and hence when a voltage is applied to the second objective lens electrode 9, an Einzel lens is formed. At this time, the first objective lens electrode 7 is grounded and thus does not function as a lens. Here, the second objective lens electrode 9 may be applied with a voltage having the positive polarity or a voltage having the negative polarity. However, if a negative voltage is applied to the second objective lens electrode 9 so as to accelerate the ion beam 11, chromatic aberration can be made smaller, and the irradiation can be carried out with the ion beam having a smaller beam diameter.

Figure 3:
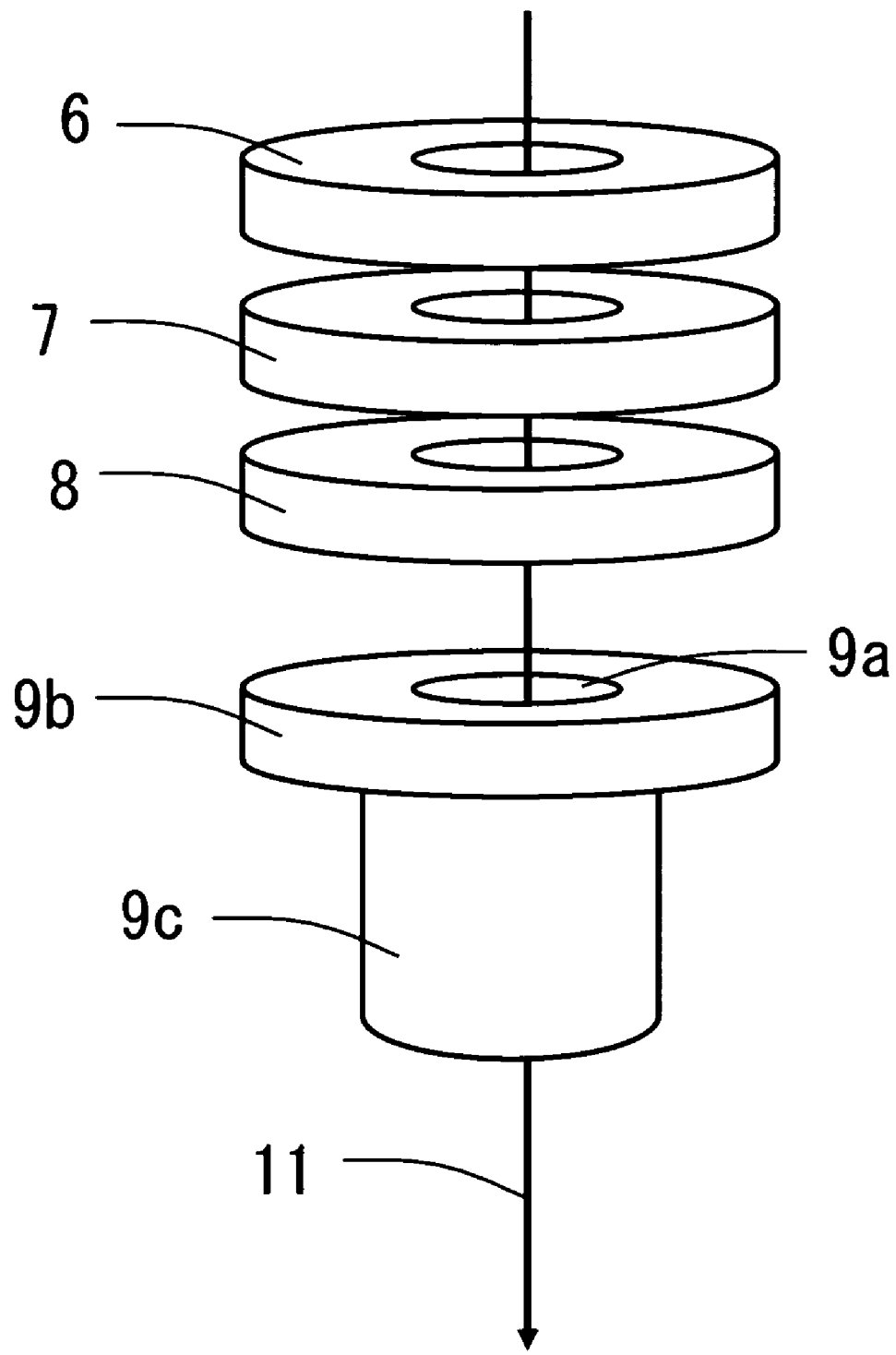
FIG. 3 is a configuration diagram of the objective lens electrodes of the charged particle beam apparatus according to the embodiment of the present invention.

FIG. 3 is a configuration diagram of the objective lens electrodes of the charged particle beam apparatus according to the present invention. Each of the first objective lens electrodes 6, 7, and 8 is a plate-like electrode which has a plane substantially perpendicular to the ion beam 11 and has a hole portion for allowing the ion beam 11 to pass therethrough. Further, the second objective lens electrode 9 has a hole portion 9a for allowing the ion beam 11 to pass therethrough, and includes a plate portion 9b having a plane substantially perpendicular to the ion beam 11 and a cylindrical portion 9c. Even when there is an insulating material disposed, as a voltage-resistant material, closer to the sample 13 side relative to the plate portion 9b, the plate portion 9b can prevent the insulating material from being irradiated by components departing from the optical axis of the ion beam 11. With this, it is possible to prevent damage or charge buildup from occurring in the insulating material due to the irradiation of the ion beam. Further, the cylindrical portion 9c is arranged so as to surround the ion beam 11, and hence it is possible to reduce an influence from an external electric field which is exerted upon the ion beam 11 passing through an inside of the cylindrical portion 9c.

Figure 7:
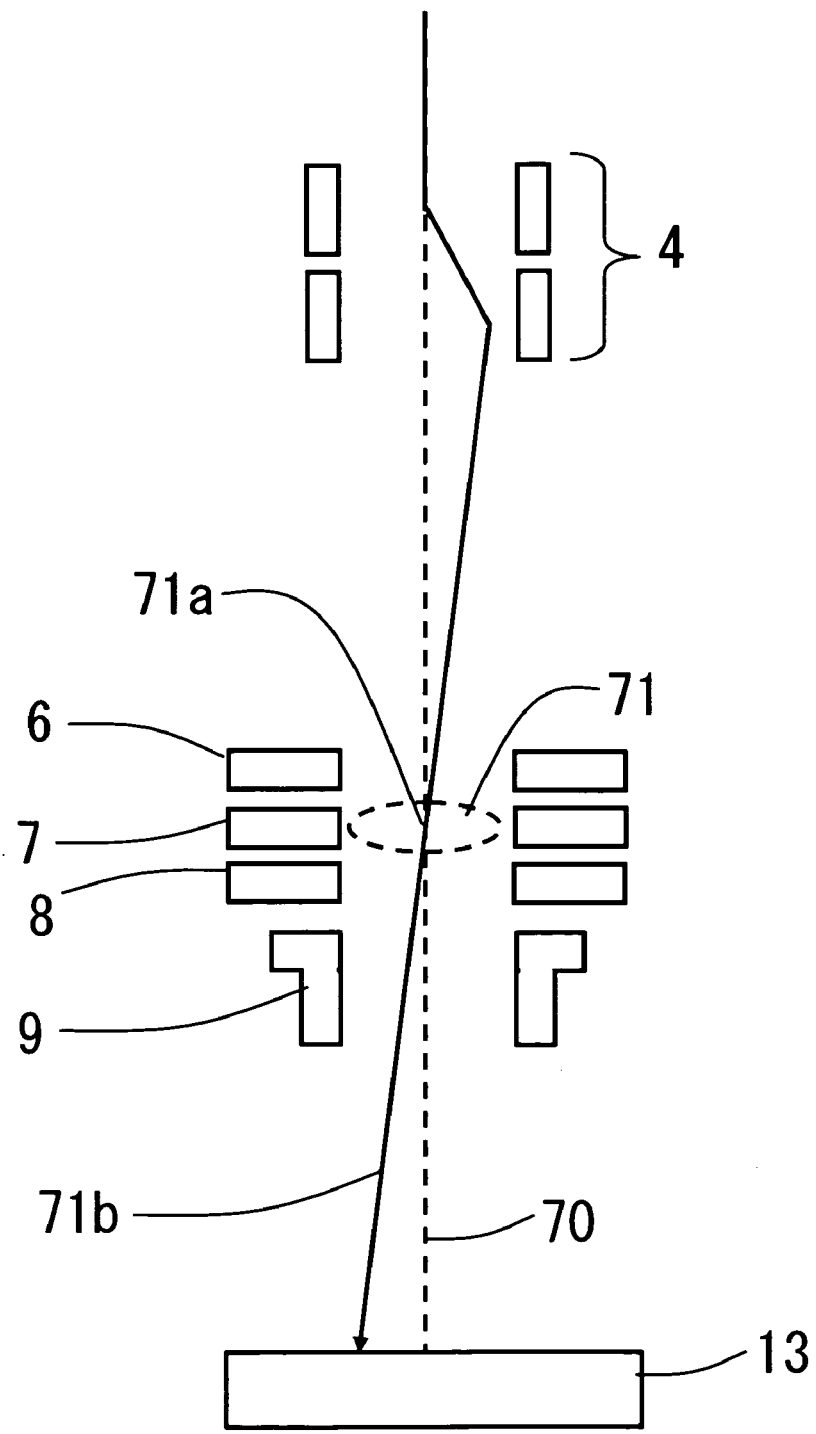
FIG. 7 is a schematic diagram of an ion optical system according to the embodiment of the present invention.

FIGS. 7 to 10 are schematic diagrams of an ion optical system according to the embodiment of the present invention. As illustrated in FIG. 7, by means of the deflection electrode 4 having electrostatic electrodes vertically provided in two stages, an ion beam 71b is deflected so as to pass through a lens center 71a of a first objective lens electric field 71. With this, the ion beam 71b always passes through the lens center 71a to irradiate the sample 13.

Figure 8:
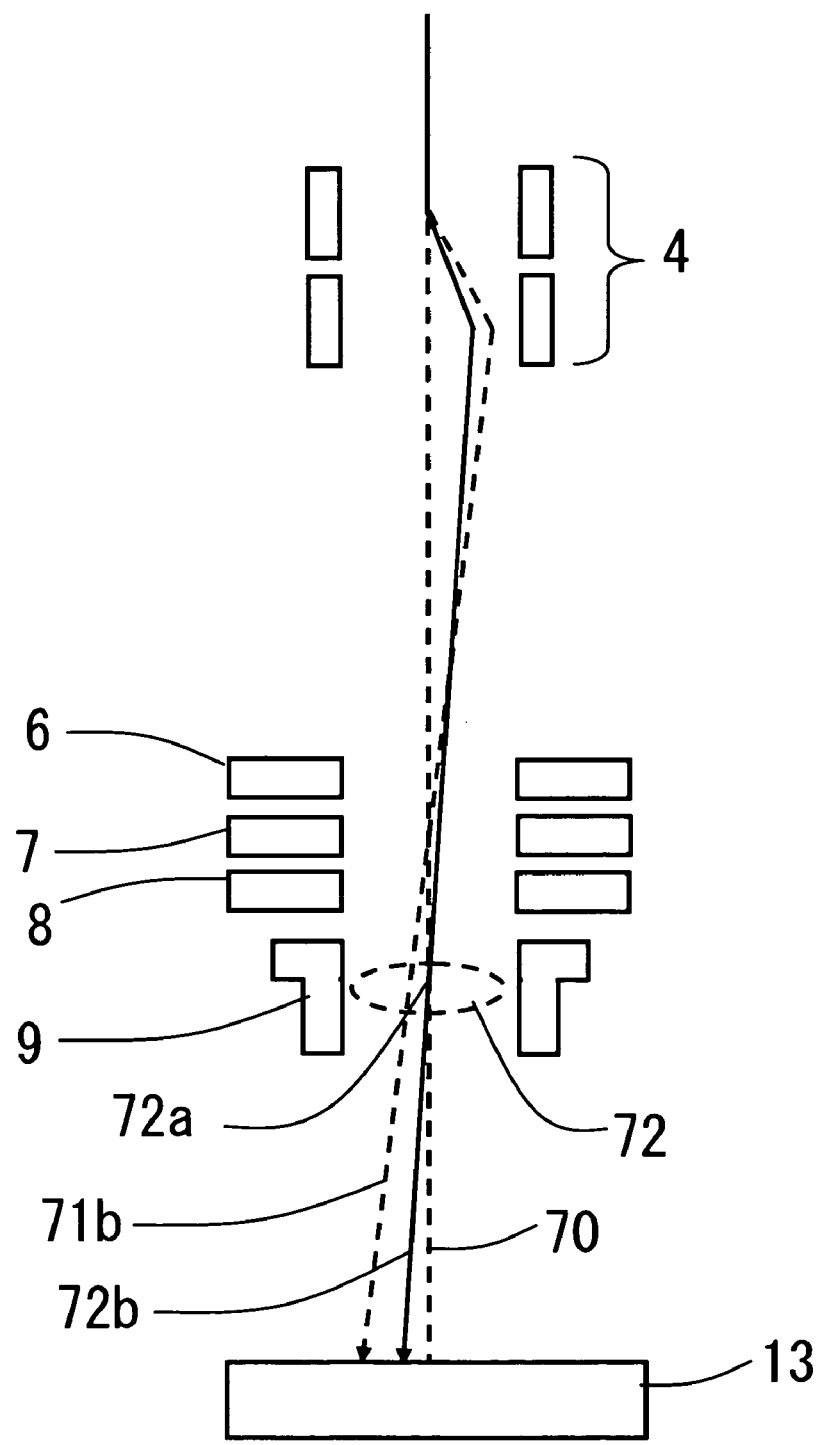
FIG. 8 is another schematic diagram of the ion optical system according to the embodiment of the present invention.

FIG. 8 is a schematic diagram of the ion optical system in a case where the sample 13 is irradiated with an ion beam 72b, which is accelerated with an acceleration voltage lower than that of the ion beam 71b, by using the second objective lens electrode 9. When the lenses are switched over, with the beam trajectory of the ion beam 71b, the ion beam 71b irradiates a position displaced from a lens center 72a of a second objective lens electric field 72. A beam which does not pass through the center of a lens is subject to aberration. This means that the beam cannot be focused on the sample 13, resulting in a blurred observation image. To address this, in response to the switchover of the lenses, the set value for the deflection electrode 4 is changed so that the ion beam 72b passes through the lens center 72a of the second objective lens electric field 72. With this, the ion beam 72b passes through the center of the objective lens even after the switchover of the lenses, with the result that the beam can be focused on the sample 13.

When the acceleration voltage for the ion beam and the objective lens to be used are changed, the irradiation position of the beam on the sample 13 may sometimes be displaced. This displacement is corrected by using the deflection electrode 4 to deflect the ion beam. As described above, the deflection electrode 4 deflects the ion beam so that the ion beam passes through the center of the objective lens, and hence even when the irradiation position is corrected, the observation image does not become blurred.

Figure 9:
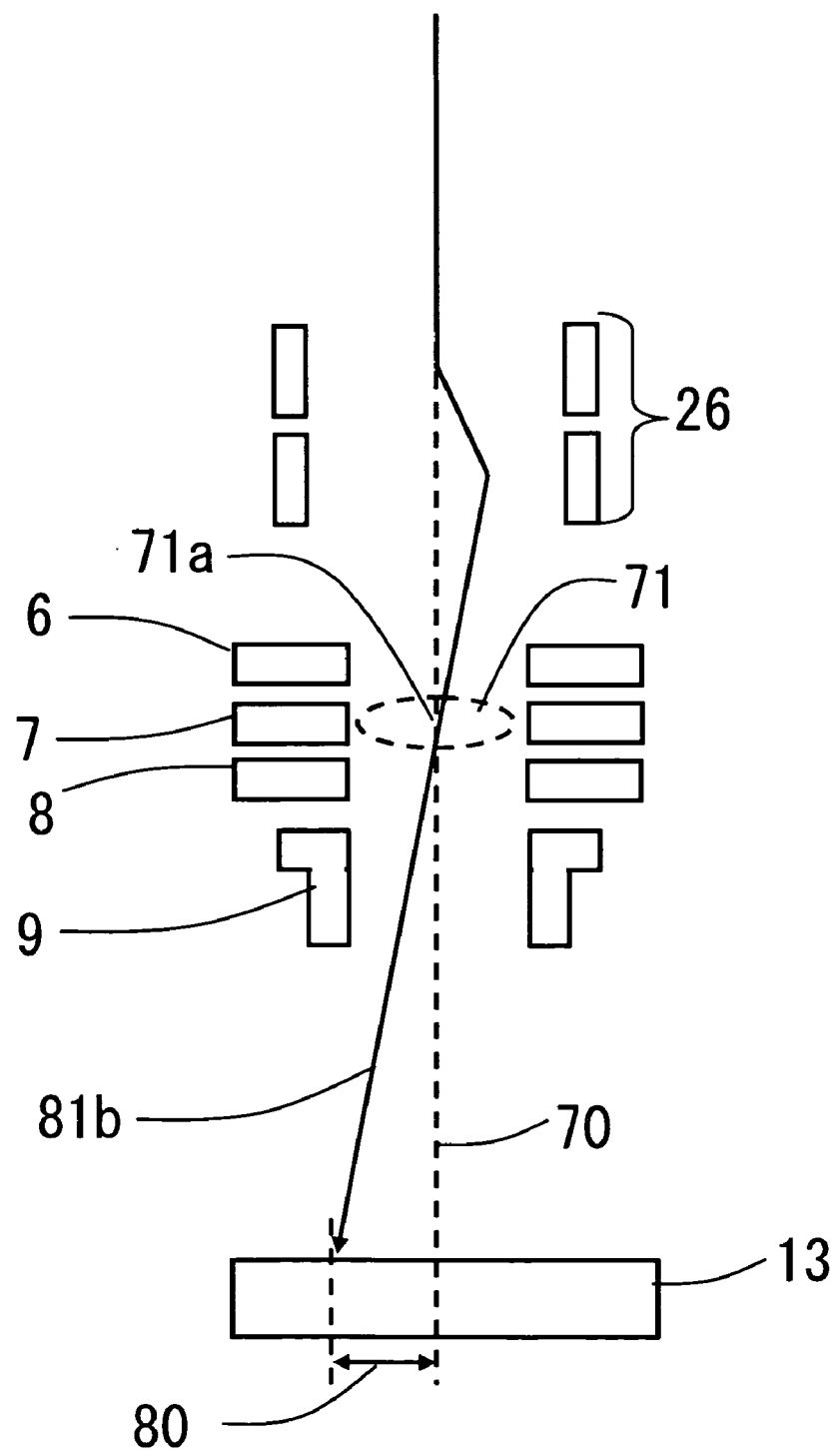
FIG. 9 is still another schematic diagram of the ion optical system according to the embodiment of the present invention.

Further, as illustrated in FIG. 9, the scanning electrode 26 causes an ion beam 81b to scan the sample 13. The scanning electrode 26 has electrostatic electrodes vertically provided in two stages. The scanning electrode 26 scans the ion beam 81b so that the ion beam 81b passes through the lens center 71a of the first objective lens electric field 71. With this, the ion beam 81b always passes through the lens center 71a to irradiate the sample 13. Further, the ion beam 81b is caused to scan the sample 13 with a scanning width 80.

Figure 10:
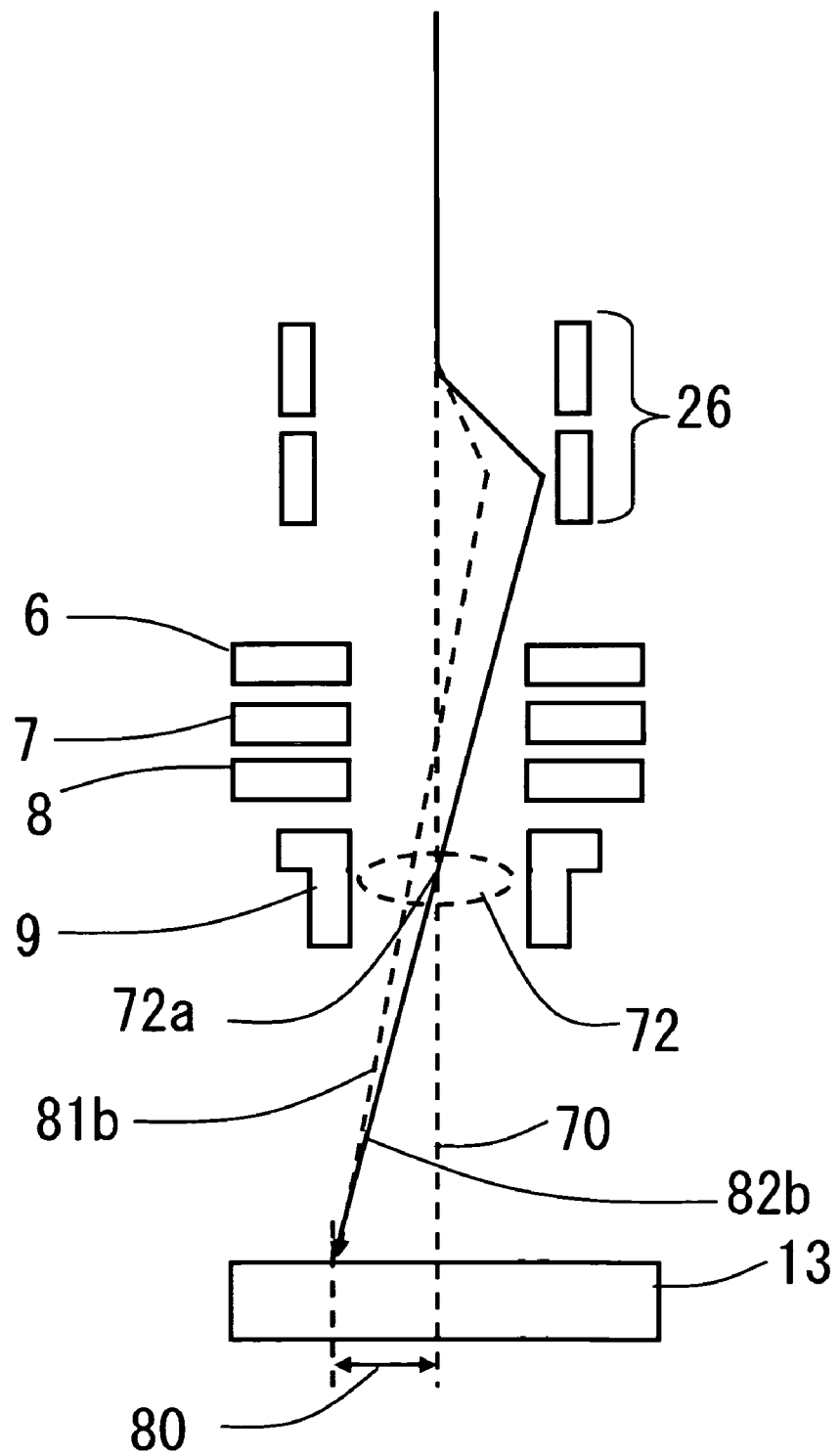
FIG. 10 is still another schematic diagram of the ion optical system according to the embodiment of the present invention.

FIG. 10 is a schematic diagram of the ion optical system in a case where the sample 13 is irradiated with an ion beam 82b, which is accelerated with an acceleration voltage lower than that of the ion beam 81b, by using the second objective lens electrode 9. When the lenses are switched over, with the beam trajectory of the ion beam 81b, the ion beam 81b irradiates a position displaced from the lens center 72a of the second objective lens electric field 72. The observation image of a sample obtained by using a beam which does not pass through the center of a lens becomes distorted. To address this, in response to the switchover of the lenses, the set value for the scanning electrode 26 is changed so that the ion beam 82b passes through the lens center 72a of the second objective lens electric field 72. With this, the ion beam 82b passes through the center of the objective lens even after the switchover of the lenses, with the result that the beam can be focused on the sample 13.

When the acceleration voltage for the ion beam and the objective lens to be used are changed, the scanning width of the beam on the sample 13 may sometimes be displaced. This displacement is corrected by using the scanning electrode 26. As described above, the scanning electrode 26 scans the ion beam so that the ion beam passes through the center of the objective lens, and hence even when the scanning width is corrected, the observation image does not become distorted.

Embodiment 1

Description is given of an example of improved resolution due to application of the charged particle beam apparatus of the embodiment of the present invention. With such amount of beam current that is used in finish processing for processing the sample 13 into a precisely-defined shape, the ion beam 11 accelerated with an acceleration voltage of 30 kV was focused on the sample 13 by the first objective lens, and the beam diameter was about several tens of nanometers. In this case, the thickness of a damaged layer formed in the sample 13 by the ion beam 11 was about 20 nm. Further, when the ion beam 11 accelerated with an acceleration voltage of 2 kV was focused on the sample 13 by the first objective lens, the beam diameter was about 200 nm. In this case, the thickness of the damaged layer formed in the sample 13 by the ion beam 11 was about 20 nm. As the acceleration voltage becomes lower, the penetration depth of the ion beam 11 into the sample 13 becomes smaller. Accordingly, when the acceleration voltage is lower, the thickness of the damaged layer generated in the sample due to the irradiation of the ion beam is smaller. However, when the ion beam is focused on the sample 13 by the first objective lens, the beam diameter is about 200 nm, resulting in an observation of low resolution. Thus, it is difficult to accurately determine the irradiation position of the ion beam.

On the other hand, when the ion beam 11 accelerated with an acceleration voltage of 2 kV was focused on the sample 13 by the second objective lens, the beam diameter was about 100 nm. By using the second objective lens, the beam diameter was able to be made smaller even with the ion beam accelerated by the low acceleration voltage. Owing to this, the irradiation position of the ion beam was able to be determined accurately.

The acceleration voltage was set to 2 kV, but any value may be set for the acceleration voltage within a range in which discharge does not occur in the second objective lens electrode 9.

Further, at the time of the switchover from the first objective lens to the second objective lens, the control unit 21 sends the previously-stored set values for the ion source 2, the focusing lens electrodes 3, the deflection electrode 4, the astigmatism correction electrode 5, and the second objective lens power source 20 to the ion source, the respective electrodes, and the power source, respectively. With this, there is no need to adjust the set value for each component every time the lenses are switched over.

Embodiment 2

Figure 4:
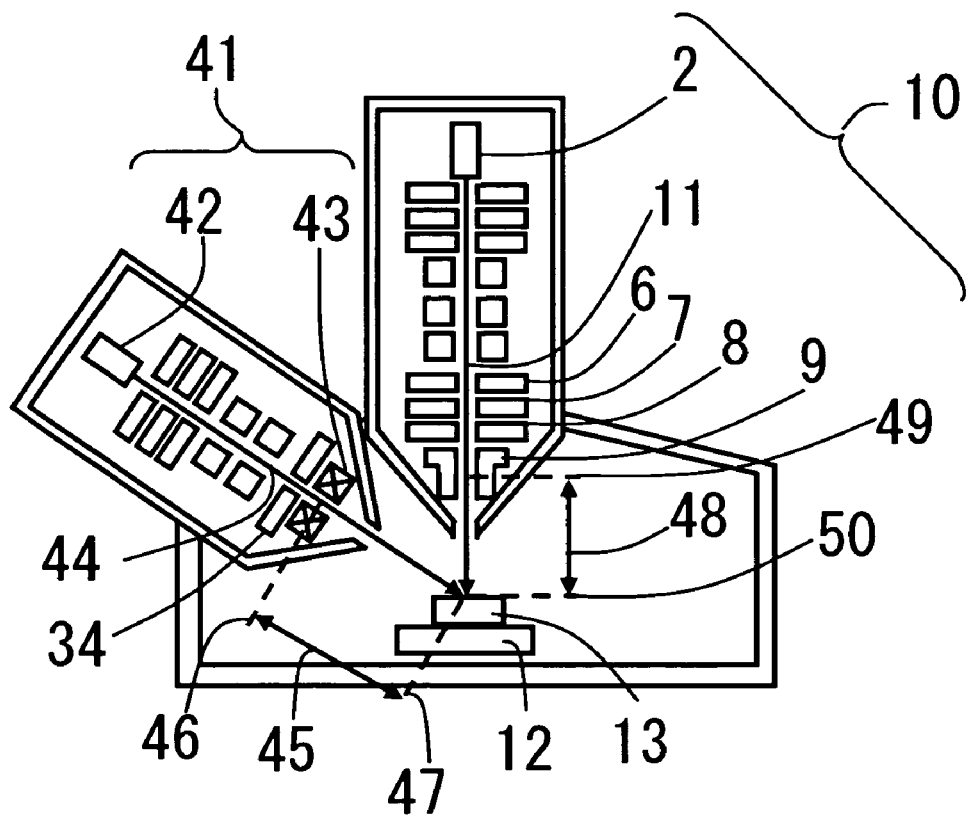
FIG. 4 is a configuration diagram of a charged particle beam apparatus according to the embodiment of the present invention.

Referring to FIG. 4, description is given of an example of a charged particle beam apparatus provided with an electron beam column. The charged particle beam apparatus includes an electron beam column 41 including an electron source 42 and an objective lens 43 for electron beam. An electron beam 44 is capable of irradiating the irradiation area of the ion beam 11 on the sample 13. By scanning and irradiating the irradiation area of the ion beam 11 with the electron beam 44, it was possible to carry out an SEM observation to observe how a desired position on the sample 13 was processed with the ion beam 11.

Note that, the second objective lens electrode 9 of the ion beam column 10 is disposed at a position closer to the sample 13 compared to the coil of the objective lens 43 for electron beam of the electron beam column 41. Specifically, a distance 45 between a center position 46 of the objective lens for electron beam and an electron beam irradiation position 47 is larger than a distance 48 between a center position 49 of the second objective lens and an ion beam irradiation position 50. With this, it was possible to reduce an influence exerted upon the ion beam 11 from an external electric field.

In a case where the objective lens of the electron beam column 41 is of electromagnetic field superposition type, when the objective lens for electron beam is formed, an electric field asymmetric with respect to the ion beam 11 is formed in the vicinity of the sample 13. The ion beam 11 may be affected by the asymmetric electric field, with the result that the beam shape of the beam irradiating the sample 13 is changed.

However, the second objective lens electrode 9 is disposed closer to the sample 13, and the cylindrical portion 9c of the second objective lens electrode 9 surrounds the ion beam 11 in the vicinity of the sample 13, and hence it was possible to reduce the influence from the asymmetric electric field.

Further, in the case where the objective lens of the electron beam column 41 is of the electromagnetic field superposition type, when the objective lens for electron beam is formed, an electric field asymmetric with respect to the electron beam 44 is formed in the vicinity of the sample 13. Due to the influence from this electric field, the beam shape of the electron beam 44 irradiating the sample 13 is changed.

However, by using the second objective lens electrode 9, it is possible to reduce the electric field asymmetric with respect to the electron beam 44 in the vicinity of the sample 13. Specifically, with respect to the electron beam 44, the cylindrical portion 9c of the second objective lens electrode 9 and the sample stage 12 are positioned so as to be substantially opposed to each other, and hence the asymmetricity of the electric field is alleviated. With this, the beam shape of the electron beam 44 was not changed significantly, and the sample 13 was thus observed with high resolution.

Further, the electron beam column 41 includes a secondary electron detector 34 for electron beam. In the case where the objective lens of the electron beam column 41 is of the electromagnetic field superposition type, when the objective lens for electron beam is formed, an electric field is generated in the vicinity of the sample 13. Secondary electrons generated by irradiating the sample 13 with the electron beam 44 are drawn to and detected by the secondary electron detector 34 for electron beam due to the electric field formed by the objective lens for electron beam. However, when the electron beam column 41 is arranged in an inclined manner with respect to the sample 13, an electric field asymmetric with respect to the electron beam 44 is formed in the vicinity of the sample 13. For this reason, the trajectory of the secondary electrons is deflected due to the influence from the asymmetric electric field, and it becomes difficult for the secondary electrons to reach the secondary electron detector 34 for electron beam.

However, by using the second objective lens electrode 9, it is possible to reduce the electric field asymmetric with respect to the electron beam 44 in the vicinity of the sample 13. With this, the influence exerted upon the secondary electrons from the asymmetric electric field is reduced. Therefore, the secondary electron detector 34 for electron beam was improved in detection efficiency for secondary electrons, enabling a secondary electron image to be obtained with high quality.

Embodiment 3

Figure 5A:
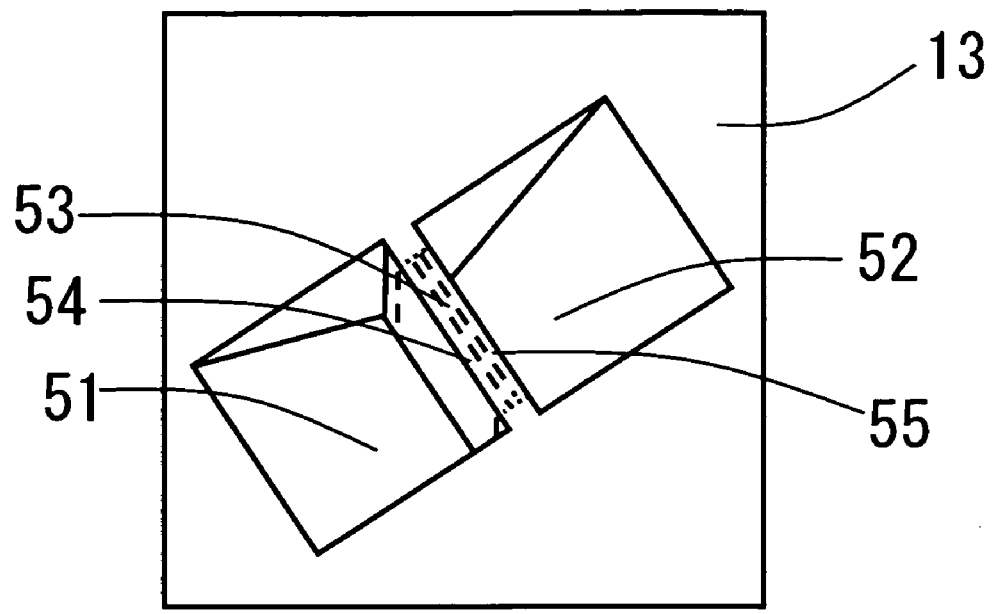
Figure 5B:
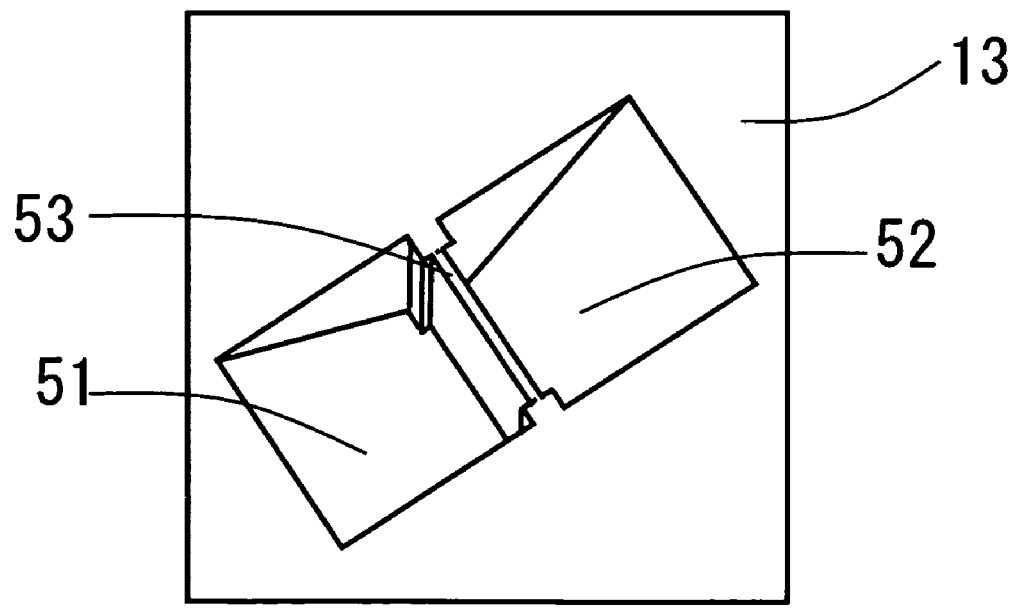
Figure 6:
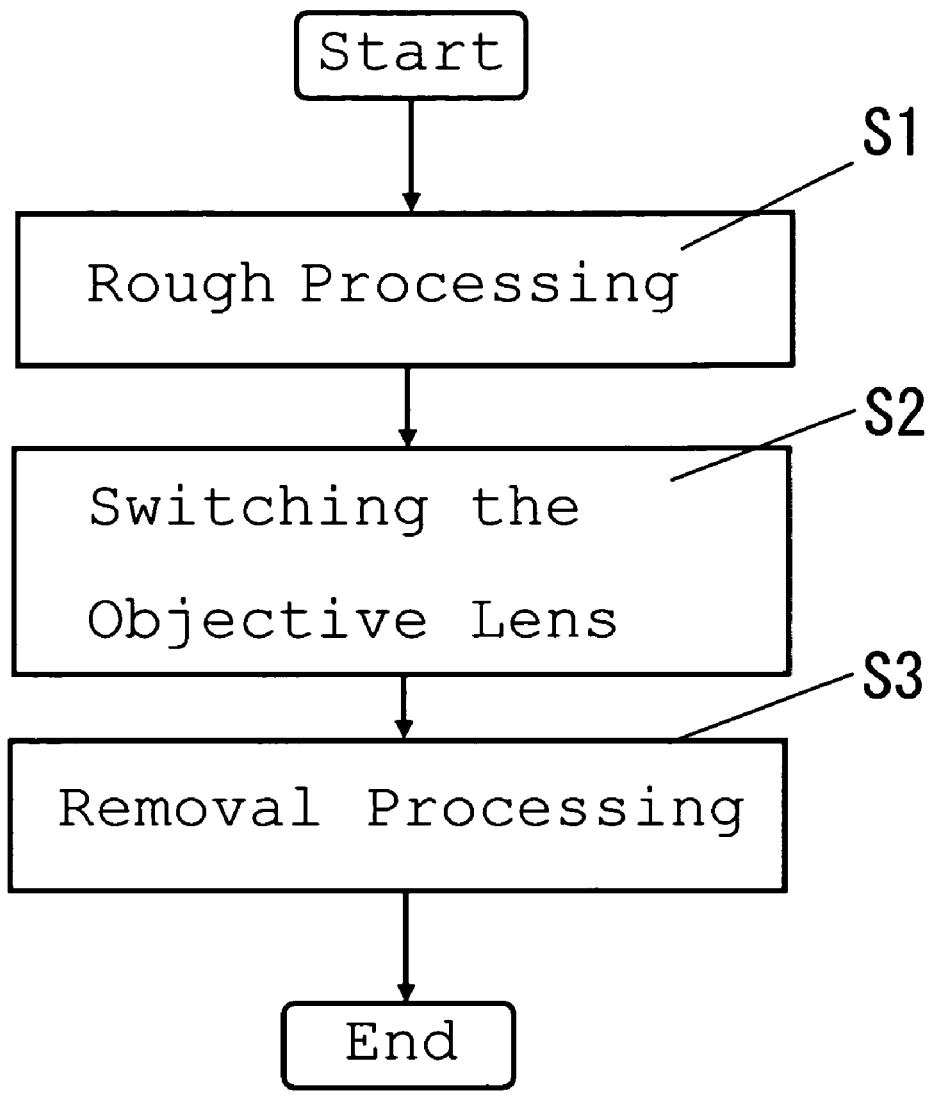
FIG. 6 is a flow chart of the sample processing method according to the embodiment of the present invention.

FIGS. 5A, 5B, and 6 are described regarding a sample processing method of the embodiment of the present invention. FIGS. 5A and 5B are schematic diagrams of sample processing of the sample processing method according to the present invention. Further, FIG. 6 is a flow chart of the sample processing method according to the present invention. A TEM sample in which the thickness of the damaged layer is thin is fabricated from the sample 13.

As illustrated in FIG. 5A, by using the ion beam 11 accelerated with an acceleration voltage of 30 kV and focused by the first objective lens, rough processing of forming processed grooves 51 and 52, which are opposed to each other, to leave a sample lamella) portion 53 to be observed therebetween is executed (S1). Through the irradiation of the ion beam 11, damaged layers 54 and 55 are formed in areas adjacent to the sample lamella portion 53.

Subsequently, the acceleration voltage is switched to 2 kV, and the objective lens is also switched to the second objective lens (S2).

Subsequently, as illustrated in FIG. 5B, the damaged layers 54 and 55 are irradiated with the ion beam 11, thereby performing removal processing (S3). With this, it was possible to cut out the sample lamella portion 53 having a smaller damaged area.

What is claimed is:

1. A charged particle beam apparatus, comprising:
a sample chamber for housing a sample; and
an ion beam column for accelerating an ion beam with an acceleration voltage, and focusing the ion beam on the sample to irradiate the sample, wherein:
the ion beam column comprises an ion source housed on a proximal side of the ion beam column and an ion optical system for irradiating the sample with the ion beam; and
the ion optical system comprises a first objective lens electrode for focusing the ion beam on the sample and a second objective lens electrode for focusing an ion beam accelerated with a second acceleration voltage, which is lower than a first acceleration voltage for accelerating the ion beam, on the sample.

2. A charged particle beam apparatus according to claim 1, wherein the second objective lens electrode is disposed on a distal side of the ion beam column, relative to the first objective lens electrode.

3. A charged particle beam apparatus according to claim 1, wherein the first objective lens electrode comprises a plurality of electrodes which have a grounded electrode disposed adjacent to the second objective lens electrode, and
wherein the grounded electrode, the second objective lens electrode, and a distal portion of the ion beam column, which is grounded, form a lens electric field for focusing the ion beam accelerated with the second acceleration voltage.

4. A charged particle beam apparatus according to claim 1, wherein the ion optical system further comprises a deflection electrode for deflecting the ion beam, which is disposed on the proximal side of the ion beam column relative to the first objective lens electrode, and
wherein the deflection electrode deflects the ion beam accelerated with the first acceleration voltage so that the ion beam passes through a lens center of the first objective lens electrode, and deflects the ion beam accelerated with the second acceleration voltage so that the ion beam passes through a lens center of the second objective lens electrode.

5. A charged particle beam apparatus according to claim 1, wherein the ion optical system further comprises a scanning electrode for scanning the ion beam, which is disposed on the proximal side of the ion beam column relative to the first objective lens, and
wherein the scanning electrode scans the ion beam accelerated with the first acceleration voltage so that the ion beam passes through a lens center of the first objective lens electrode, and scans the ion beam accelerated with the second acceleration voltage so that the ion beam passes through a lens center of the second objective lens electrode.

6. A charged particle beam apparatus according to claim 1, wherein the ion optical system further comprising:
a focusing lens electrode for focusing the ion beam generated from the ion source; and
an astigmatism correction electrode for correcting astigmatism of the ion beam.

7. A charged particle beam apparatus according to claim 1, further comprising:

an input unit for inputting the first acceleration voltage and the second acceleration voltage;
a storage unit for storing set values for the ion optical system, which correspond to the first acceleration voltage and the second acceleration voltage; and
a control unit for setting the set values for the ion optical system,
wherein the storage unit stores first set values corresponding to the first acceleration voltage and second set values corresponding to the second acceleration voltage, and
wherein the control unit sets the first set values for the ion optical system when the first acceleration voltage is input from the input unit, and sets the second set values for the ion optical system when the second acceleration voltage is input from the input unit.

8. A charged particle beam apparatus according to claim 7, wherein the first set values comprise the set value for the first objective lens electrode indicating a constant voltage value, and the set value for the second objective lens electrode indicating 0, and
wherein the second set values comprise the set value for the first objective lens electrode indicating 0, and the set value for the second objective lens electrode indicating a constant voltage value.

9. A charged particle beam apparatus according to claim 7, wherein the first set values and the second set values are set so that the ion beam accelerated with the first acceleration voltage and the ion beam accelerated with the second acceleration voltage irradiate the same area.

10. A charged particle beam apparatus according to claim 1, wherein the second objective lens electrode comprises a hole portion for allowing the ion beam to pass therethrough, a plate portion having a plane substantially perpendicular to the ion beam, and a cylindrical portion for allowing the ion beam to pass therethrough.

11. A charged particle beam apparatus according to claim 1, further comprising an electron beam column capable of irradiating, with an electron beam, an irradiation area of the ion beam on the sample,
wherein the electron beam column further comprises a coil of an objective lens for electron beam for focusing the electron beam on the sample, and
wherein a distance between a center of the coil of the objective lens for electron beam and the sample is larger than a distance between a center of the second objective lens electrode of the ion beam column and the sample.

12. A sample processing method, comprising:
a first processing step of accelerating an ion beam with a first acceleration voltage, focusing the ion beam by means of a first objective lens, and processing a sample; and
a second processing step of accelerating the ion beam with a second acceleration voltage, which is lower than the first acceleration voltage, focusing the ion beam by means of a second objective lens, which is disposed closer to the sample than the first objective lens, and processing the sample.

13. A sample processing method according to claim 12, wherein the second processing step comprises removing a damaged portion formed in the sample in the first processing step.

* * * * *